United States Patent
Shih et al.

(10) Patent No.: US 9,367,655 B2
(45) Date of Patent: Jun. 14, 2016

(54) TOPOGRAPHY-AWARE LITHOGRAPHY PATTERN CHECK

(75) Inventors: I-Chang Shih, Tucheng (TW);
Chung-min Fu, Chungli (TW);
Ying-Chou Cheng, Zhubei (TW);
Yung-Fong Lu, Keelung (TW);
Feng-Yuan Chiu, Hsinchu (TW); Chiu Hsiu Chen, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 465 days.

(21) Appl. No.: 13/443,568

(22) Filed: Apr. 10, 2012

(65) Prior Publication Data
US 2013/0267047 A1    Oct. 10, 2013

(51) Int. Cl.
*H01L 21/66* (2006.01)
*G06F 17/50* (2006.01)
*G03F 7/20* (2006.01)

(52) U.S. Cl.
CPC ............ *G06F 17/5027* (2013.01); *G03F 7/705* (2013.01); *H01L 22/10* (2013.01); *H01L 22/12* (2013.01); *H01L 2924/0002* (2013.01)

(58) Field of Classification Search
CPC ..................................................... H01L 22/10
USPC ............................................ 438/14; 716/112
See application file for complete search history.

(56) References Cited

U.S. PATENT DOCUMENTS

| | | | | |
|---|---|---|---|---|
| 7,725,861 | B2* | 5/2010 | Cheng et al. | 716/126 |
| 7,954,072 | B2* | 5/2011 | Liu et al. | 716/54 |
| 8,037,575 | B2* | 10/2011 | Cheng et al. | 16/54 |
| 8,214,772 | B2* | 7/2012 | Liu et al. | 716/52 |
| 8,336,002 | B2* | 12/2012 | Chang et al. | 716/52 |
| 8,372,742 | B2* | 2/2013 | Cheng et al. | 438/622 |
| 2007/0266360 | A1* | 11/2007 | Cheng et al. | 716/11 |
| 2007/0266362 | A1* | 11/2007 | Lai et al. | 716/19 |
| 2013/0267047 | A1* | 10/2013 | Shih et al. | 438/14 |

OTHER PUBLICATIONS

Gupta, Puneet, et al., "Wafer Topography-Aware Optical Proximity Correction," IEEE Transactions on computer-Aided Design of Integrated Circuits and Systems, vol. 25, No. 12, Dec. 2006, p. 2747-2756.

* cited by examiner

*Primary Examiner* — George Fourson, III
(74) *Attorney, Agent, or Firm* — Haynes and Boone, LLP

(57) ABSTRACT

The present disclosure provides a method. The method includes obtaining an integrated circuit (IC) layout. The method includes providing a polishing process simulation model. The method includes performing a lithography pattern check (LPC) process to the IC layout. The LPC process is performed at least in part using the polishing process simulation model. The method includes detecting, in response to the LPC process, possible problem areas on the IC layout. The method includes modifying the polishing process simulation model. The method includes repeating the performing the LPC process and the detecting the possible problem areas using the modified polishing process simulation model.

20 Claims, 5 Drawing Sheets

TOPOGRAPHY-AWARE LITHOGRAPHY PATTERN CHECK

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Traditionally, IC designers may utilize a set of design rules (for example design rules provided by a semiconductor fabrication foundry) to ensure that an IC design will fall within manufacturing tolerances. However, as the semiconductor industry has progressed into nanometer technology process nodes in pursuit of higher device density and higher performance, following design rules alone may not be able to ensure the successful fabrication of an IC. Lithography pattern check (LPC) simulations may also need to be performed on an IC design. LPC simulations allow IC designers and foundry personnel to see what effects the actual IC fabrication processes may have on eventual shapes of the various features on the IC. Therefore, accurate LPC simulations may allow IC designers to better predict the yield and performance of their ICs. However, conventional LPC simulations may not fully take into account of the topography variations on a semiconductor wafer surface.

Therefore, although existing LPC simulations have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
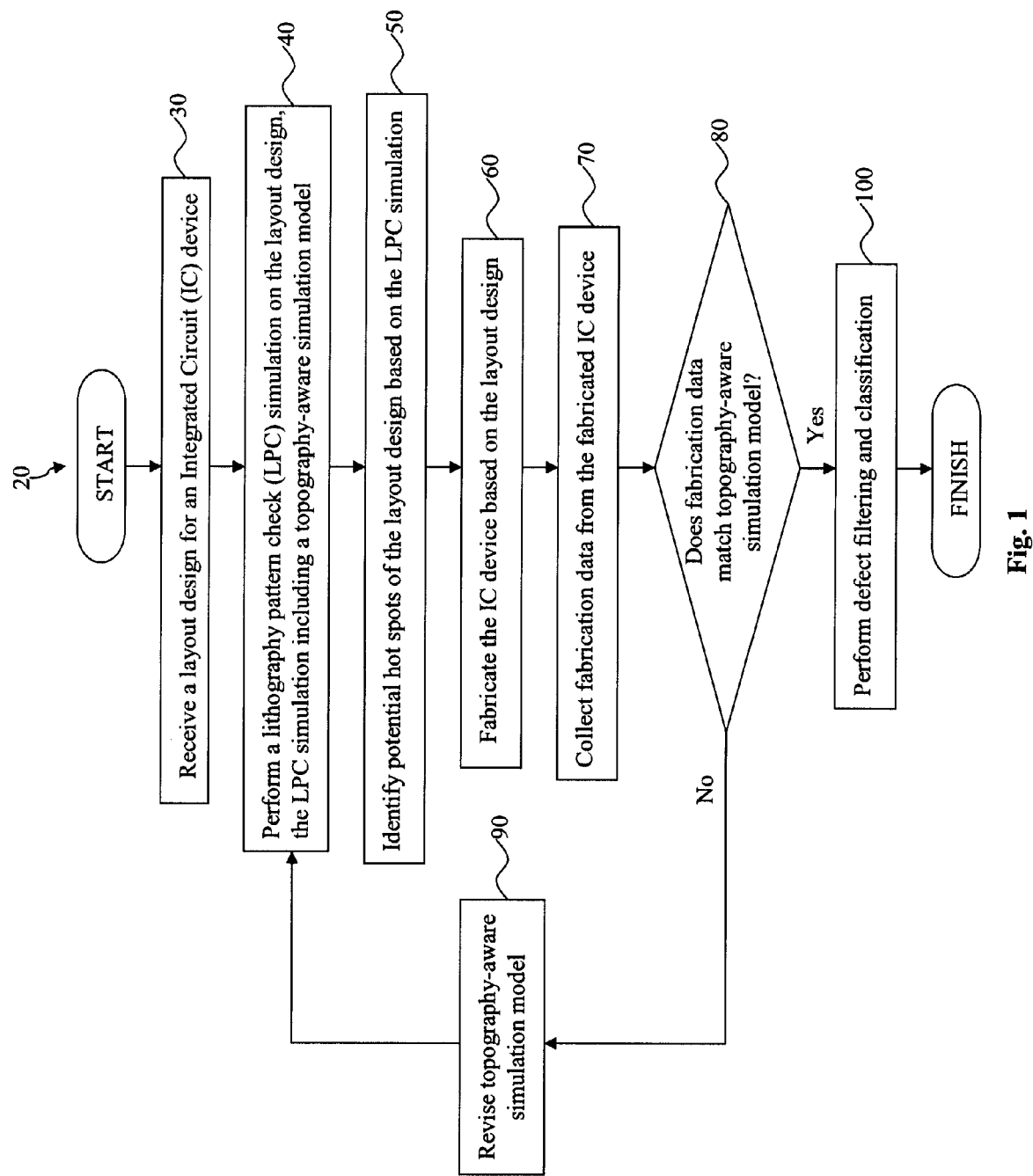
FIG. 1 illustrates a flowchart illustrating a method of performing a topography-aware LPC simulation according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Modern day Integrated Circuit (IC) design and fabrication may involve several stages. IC designers may first generate circuit schematics of an IC (or an IC chip). The circuit schematics may then be converted to an IC layout design, which may be performed by the IC designers or layout engineers. The IC layout design is sent to a semiconductor manufacturer, for example a semiconductor foundry, which performs actual fabrication of the IC on one or more semiconductor wafers. The wafers containing the ICs are then tested, binned, and packaged.

A layout of the IC contains a plurality of contours and polygons that represent the various IC features on the IC, for example metal lines or gates. Due to limitations in fabrication technologies, actual fabricated IC features may not resemble their corresponding contours and polygons in the IC layout 100%. To account for these differences, simulations such as Lithography Pattern Check (LPC) simulations may need to be performed on the IC layout design, so as to simulate the effects the actual fabrication processes will have on the IC features. In other words, the LPC simulations allow IC designers, foundry engineers, or even OPC (Optical Proximity Correction) engineers to better predict the likely yield and performance of an IC.

As semiconductor devices progress to smaller technology nodes, the scaled down feature sizes are more sensitive to fabrication process variations and other fabrication related effects. Hence, it may be more necessary than ever before to run LPC simulations on IC layout designs. Furthermore, the effectiveness of the LPC simulations—which depends on the accuracy of its various models—becomes more important as well. However, conventional LPC simulations may not sufficiently take wafer topography variations into account. In many instances, conventional LPC simulations simply treat each layer of a wafer as having a flat surface. Yet due to various factors such as pattern densities and loading effects, actual layer surfaces may exhibit topography variations (i.e., not flat) even after a polishing process is performed. Furthermore, these topography variations may accumulate, as multiple layers that each have topography variations are stacked on top of one another. As a result, IC performance cannot be accurately predicted based on the conventional LPC simulations, and various fabrication problems may arise. For example, the failure of conventional LPC simulations to properly take into account of wafer topography variations may lead to Depth of Field (DOF, also referred to as Depth of Focus in some instances) margin errors, which may manifest either in an DOF over-kill or an DOF under-kill scenario.

According to the various aspects of the present disclosure, a topography-aware LPC simulation is disclosed. An example process flow of the topography-aware LPC simulation of the present disclosure is illustrated in a flowchart of FIG. 1. Referring to FIG. 1, the flowchart includes a method 20 of fabricating a semiconductor device using an LPC simulation.

The method 20 includes a block 30, in which a layout design for an IC device is received. The IC device may be an IC chip. The layout design for the IC device may be generated by IC design engineers or IC layout engineers. The layout design specifies the location and arrangement of the various features and components on the IC chip. In some embodiments, the layout design may be in a form of a computer file, for example in a Graphic Database System (GDS) file format. The GDS file containing the layout design may be sent to an entity that manufactures ICs, for example a semiconductor fabrication foundry.

The method 20 includes a block 40, in which an LPC simulation is performed on the layout design. The LPC simulation may be performed for the full IC chip. In various embodiments, the LPC simulation may include simulations for parameters such as Mask Error Enhancement Factor (MEEF), NILS (Normalized Image Log-Scope—a metric of aerial image quality), intensity, contrast, defocus, etc. As discussed above, the LPC simulation allows IC design or foundry personnel to simulate the fabrication of the IC device (based on the layout design provided) under estimated process conditions, so as to gain insight with respect to the performance and yield of the IC device.

According to the various aspects of the present disclosure, the LPC simulation here is a topography-aware simulation and includes a topography-aware simulation model. The topography-aware simulation model may be established by a semiconductor manufacturer, for example a semiconductor foundry, based on existing fabrication data. In some embodiments, the topography-aware simulation model includes a polishing process monitor component. As an example, the polishing process monitor component may be a chemical-mechanical-polishing (CMP) defocus monitor. The CMP defocus monitor may include simulation models for a plurality of process parameters of a CMP process. In various embodiments, the process parameters of a CMP process may include parameters such as slurry type, slurry rate, platen speed, polishing pressure/force, etc.

The CMP defocus monitor may also include simulation models for pattern density variations of semiconductor device features in the layout design. Pattern density may refer to the number of IC features per unit area for a predefined region on an IC chip. Variations in pattern density throughout different areas of an IC chip may lead to different polishing rates in these areas. The simulation models for pattern density variations take into account of the effects on polishing due to the pattern density variations.

The CMP defocus monitor may also include simulation models that account for wafer surface topography variations accumulated through a plurality of layers. In other words, the CMP defocus monitor takes into account of the topography variations (due to various process related reasons) for each layer of the IC device. Therefore, the topography variations from a first layer will be "saved" and applied to a second layer on top. The second layer in effect "inherits" the topography variations from the first layer underneath, and its own topography variations are added onto the topography variations from the first layer, so that an accumulated topography variation may be obtained. This continues with additional layers (for example, third, fourth, fifth layers) formed on top of the second layer. In the end, an overall topography variation is obtained by the CMP defocus monitor, which takes into account of topography variations for every single layer of the IC device.

It is understood that the various simulation models of the topography-aware simulation model discussed above are merely examples and are not intended to be limiting. Furthermore, the topography-aware simulation model may contain additional models that help predict a true topography of the IC device as it undergoes fabrication. For reasons of simplicity, these additional models are not discussed in detail herein.

Still referring to FIG. 1, the method 20 includes a block 50, in which hot spots of the layout design are identified based on the LPC simulation performed in the block 40. Hot spots of the layout design may refer to areas of the chip where problems are likely to occur, which may be attributed to insufficient process margin or sub-optimal layout, etc. For example, two adjacent IC features may be placed in proximity with one another. While these two features are not meant to be in contact with each other, process variations during actual fabrication may cause these features to be "moved" closer to each other than the layout design would otherwise dictate, which may sometimes lead to electrical shorting. The LPC simulations performed in block 40 may catch these types of issues. As a result, the area of the IC chip corresponding to these problematic features may be identified as hot spots.

The identification of hot spots is beneficial, because IC designers and/or layout and OPC engineers may be able to adjust the layout of these problematic IC features so as to avoid the potential problem. For example, if the hot spot indicates that two adjacent features may be in risk of being shorted when they are fabricated, then IC designers and/or layout and OPC engineers may place these features farther apart than in the initial design. That way, even if process variations lead to shifts in placements of the IC features, they are unlikely to be in physical contact, thereby preventing electrical shorting.

The method 20 includes a block 60, in which an IC device is actually fabricated according to the layout design. The IC device may be considered one IC chip on a wafer, or a plurality of IC chips, or the wafer itself, or a plurality of wafers. In some embodiments, the IC device is fabricated at a semiconductor foundry.

The method 20 include a block 70, in which actual fabrication data is collected from the fabricated IC device. The fabrication data may be collected via tools such as optical scanners, electronic microscopes, and other suitable tools capable of examining the fabricated IC device in detail and monitoring the feature patterns on the fabricated IC device. In some embodiments, the fabrication data collected may include topography-related data of the fabricated IC device.

The method 20 includes a decision block 80, in which a determination is made as to whether the fabrication data collected in block 70 matches results predicted by the topography-aware simulation model. If the answer is no, that indicates the topography-aware simulation model is not accurate enough and needs to be revised. In that case, the method 20 then proceeds to a block 90, in which the topography-aware simulation model is revised based on the collected fabrication data of the IC device. Thereafter, the method 20 may proceed back to block 40 to repeat the LPC simulation again, this time using the revised topography-aware simulation model.

The blocks 40-90 may therefore constitute a loop, which can be executed a plurality of times until the fabrication data substantially matches the results predicted by the most up-to-date topography-aware simulation model. In that case, the answer returned by the decision block 80 will be a yes, which means the topography-aware simulation model is accurate enough, and that no further adjustment to the simulation model is necessary. The method 20 will then proceed to a block 100, in which defect filtering and classification is performed on the IC device.

It is understood that the method 20 containing blocks 30-100 discussed above merely illustrates one example embodiment of performing a topography-aware LPC simulation process according to the various aspects of the present disclosure. Other embodiments of the topography-aware LPC simulation process may contain other steps or have different variations of the steps similar to those described in blocks 30-100. For reasons of simplicity, these other embodiments are not discussed in detail herein.

Figure 2:
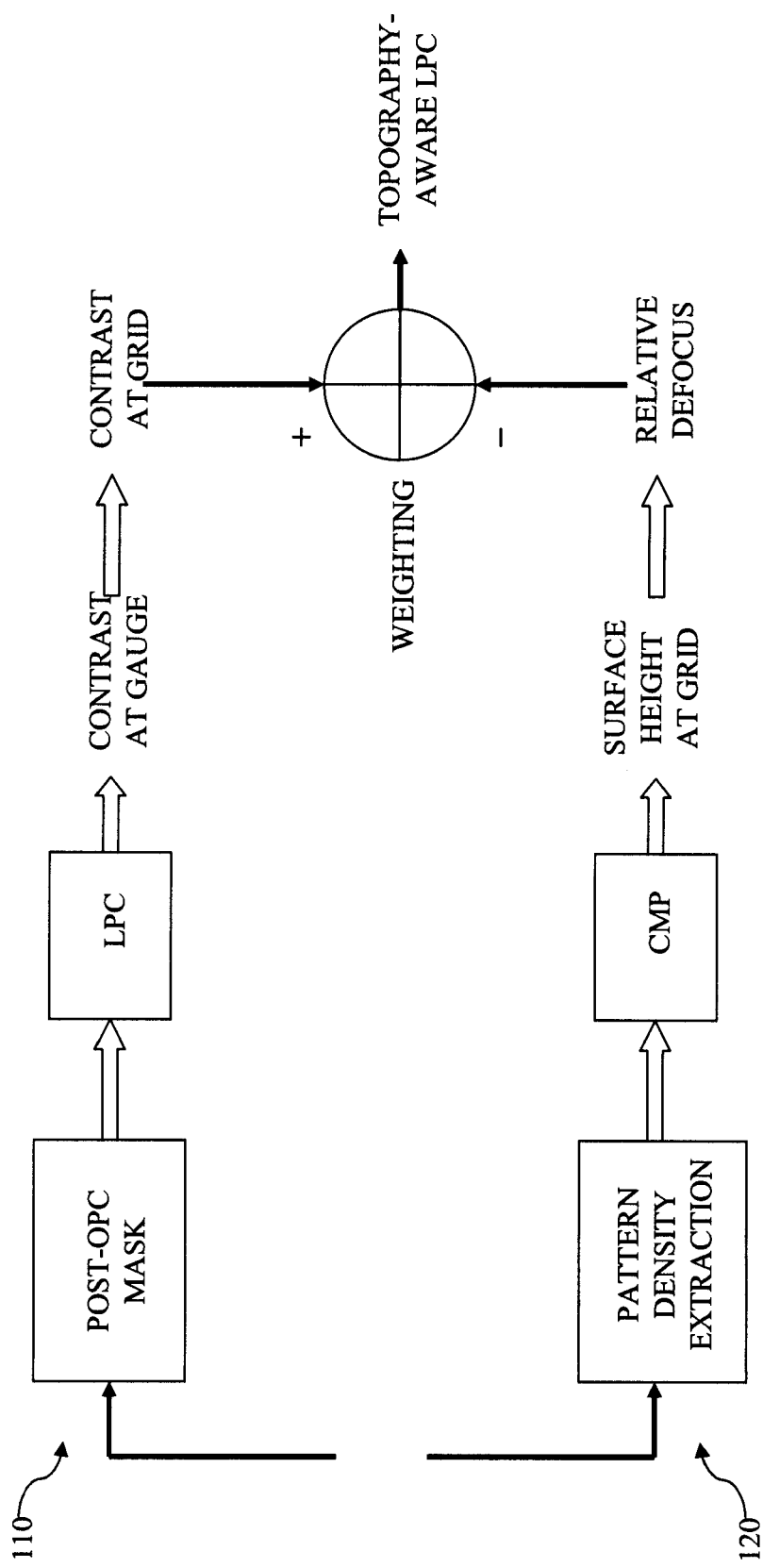
FIG. 2 illustrates a simplified diagrammatic process flow that illustrates one aspect of the topography-aware LPC simulation of FIG. 1.

FIG. 2 illustrates a simplified diagrammatic process flow that illustrates one aspect of the topography-aware LPC simulation process discussed above in FIG. 1. Referring to FIG. 2, a top half flow 110 involves an LPC process without taking topography variations into consideration, and a bottom half flow 120 involves a determination of topography variations associated with a CMP process. Based on the top half flow 110, the LPC simulation is performed by treating the wafer surface as a substantially flat surface after a CMP process. However, this will not be the case in actuality. Consequently, the DOF associated with the LPC simulation will not be accurate, and the contrast associated with the device features will be degraded.

To compensate for this defocus problem, the bottom half flow 120 will quantify the window budget degradation due to film surface fluctuations (i.e, topography variations) and compute a relative defocus from CMP simulation in proximity ranges. For example, the pattern density is extracted, a CMP process is performed, and wafer surface height is obtained at a wafer grid to calculate relative defocus. The relative defocus may be defined as a difference between surface height and average height in proximity range. The relative defocus may be computed with all possible grid locations relative to proximity window. The relative defocus is then weighted into (added or subtracted) the contrast at grid from the top half flow 110 to produce a topography-aware LPC process. Alternatively stated, the LPC process associated with the top half flow 110 may produce a DOF that is not accurate, due to its omission of the topography variation information. The relative defocus obtained from the bottom half flow 120 compensates for the DOF from the top half flow 110, and thus a compensated DOF will be accurate and will produce a sharper contrast for the features on the wafer. In this manner, a topography-aware LPC may be produced, though it is understood that FIG. 2 is merely one of many examples of producing a topography-aware LPC.

Figure 3:
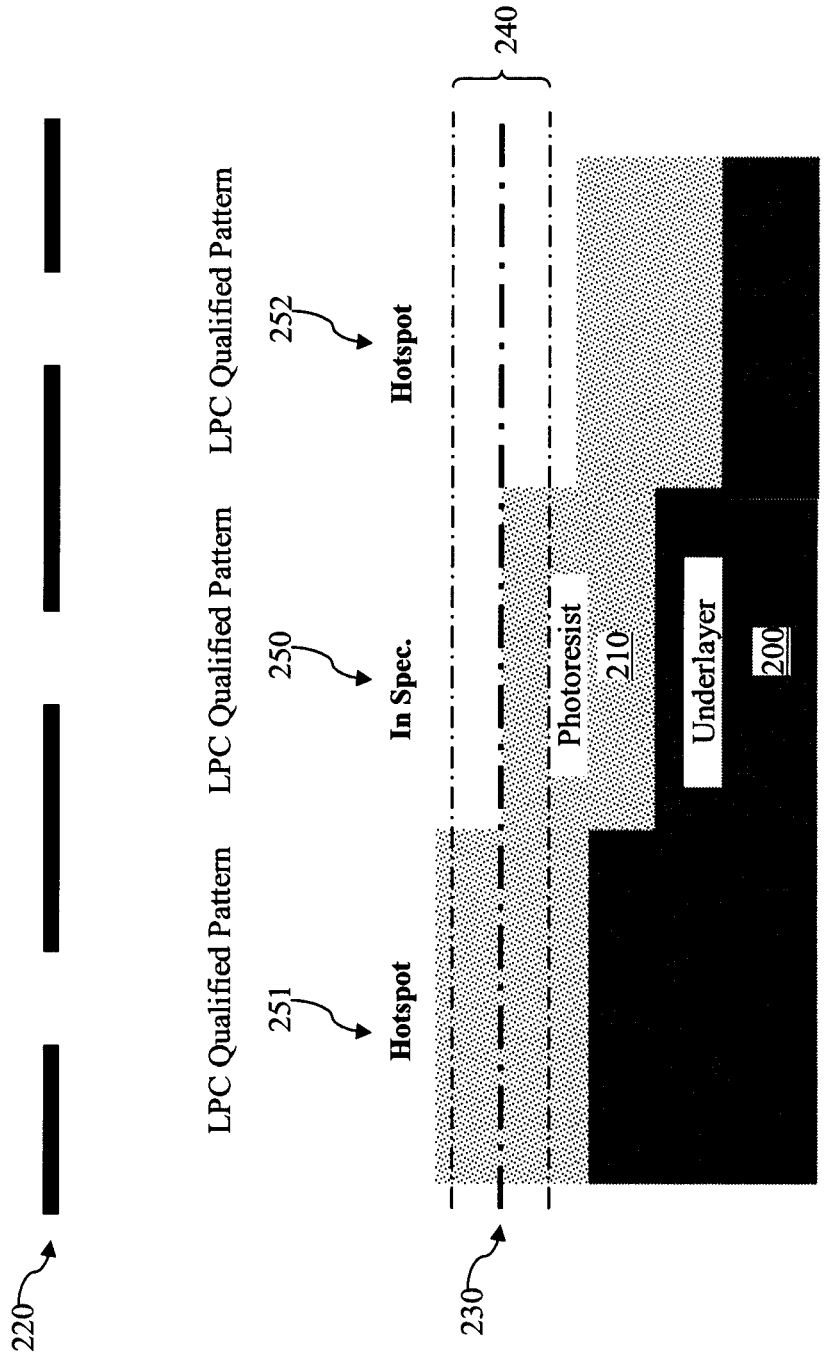
FIG. 3 illustrates a simplified example graphical illustration of hot spot identification in accordance with the various aspects of the present disclosure.

FIG. 3 is a simplified example graphical illustration of how the hot spots may be identified in accordance with the various aspects of the present disclosure. As is illustrated in FIG. 3, an underlayer 200 has topography variations, meaning its surface is not flat. Therefore, a photoresist layer 210 formed on the underlayer 200 is also not flat, as the photoresist layer 210 "inherits" the topography variations of the underlayer 200. Furthermore, due to variations in a lithography process and variations in the thickness of the photoresist layer 210, the surface topography of the photoresist layer 210 may exhibit even more variations. As discussed above, these topography variations are accounted for by the topography-aware simulation models.

When a lithography process is performed through a mask 220, there is a focal plane 230 under a nominal condition of the lithography process. IC device patterns (their surfaces) that fall on this focal plane 230 will have the best contrast and clarity. As IC device patterns move away from the focal plane 230, the contrast and clarity will degrade. For example, a DOF tolerance 240 is shown in FIG. 3. If IC device patterns fall outside of this DOF tolerance 240, their contrast or clarity may be considered poor enough as to constitute a potential failure—i.e, a hot spot.

As examples, three LPC qualified IC device patterns 250-252 are shown in FIG. 3. The pattern 250 falls within the DOF tolerance 240. Therefore, the pattern 250 is considered to be within specification limits and does not constitute a hot spot. On the other hand, due to the topography variations (which may be caused by factors such as underlayer unevenness, lithography process variations, and/or photoresist layer thickness variations, etc), the patterns 251 and 252 fall outside of the DOF tolerance 240. Therefore, the patterns 251-252 are considered to be outside of specification limits and are identified as hot spots, even though they were initially LPC qualified patterns. The identification of these hot spots will allow designers and/or layout and OPC engineers to revise the layout design so as to minimize the likelihood of failure and to improve performance and yield.

Figure 4:
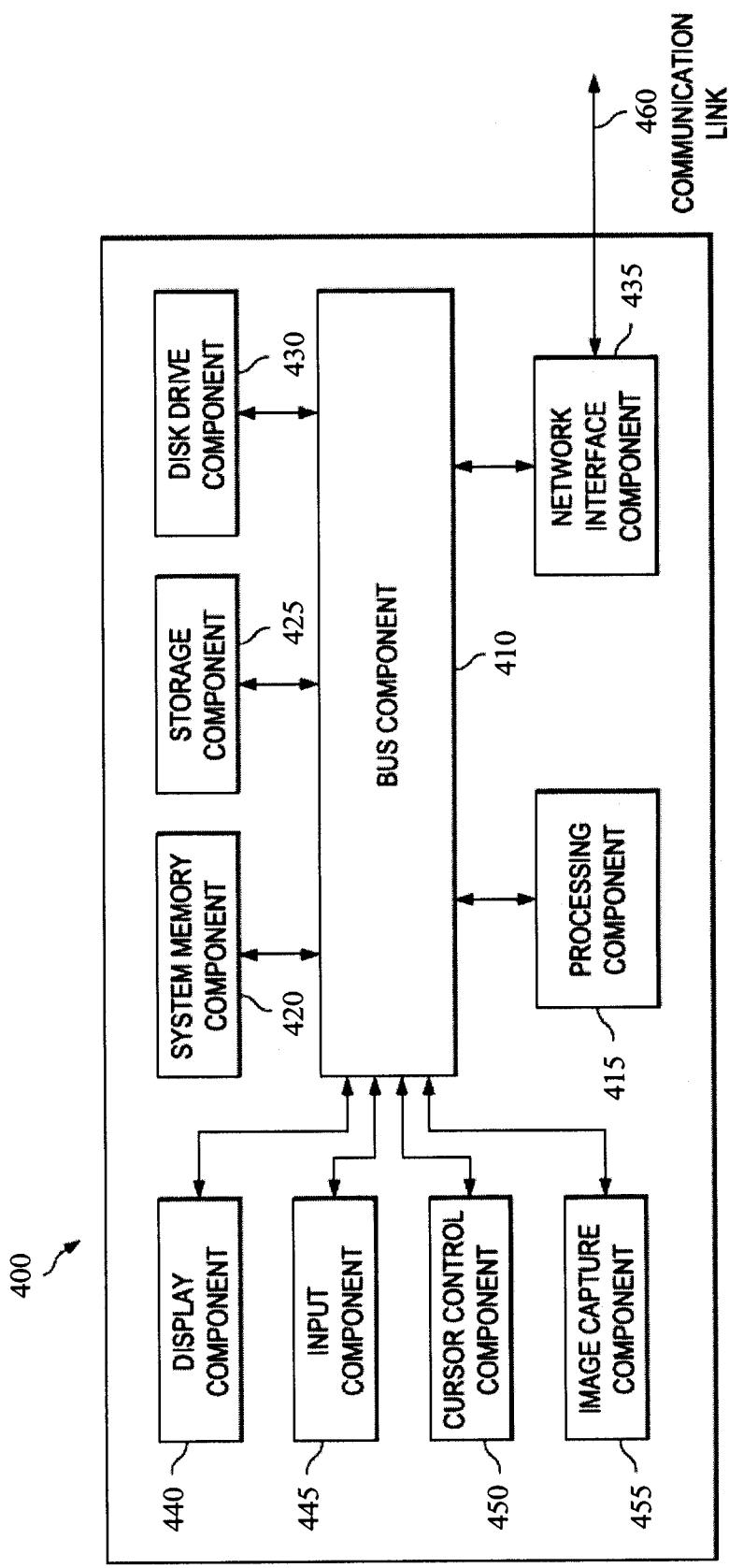
FIG. 4 illustrates a block diagram of a computer system 400 that can be used to implement the various aspects of the present disclosure.

FIG. 4 is a block diagram of a computer system 400 that can be used to implement the topography-aware LPC simulation discussed above. For example, the computer system 400 may be used to implement the various method blocks of the method 20 of FIG. 1. The computer system 400 may include a network communications device capable of communicating with a network. The computer system 400 may also include a network computing device, for example, a network server, a computer processor, an electronic communications interface, etc.

In accordance with various embodiments of the present disclosure, the computer system 400 includes a bus component 410 or other suitable communication mechanisms for communicating information, which interconnects subsystems and components, such as a processing component 415 (e.g., processor, micro-controller, digital signal processor (DSP), etc.), a system memory component 420 (e.g., Random Access Memory or RAM), a static storage component 425 (e.g., Read-Only Memory ROM), a disk drive component 430 (e.g., magnetic or optical), a network interface component 435 (e.g., a modem or an Ethernet card), a display component 440 (e.g., touch-screens, cathode ray tube (CRT) displays, or a liquid crystal display (LCD)), an input component 445 (e.g., keyboard or touch-sensitive components operable to detect a touch by a human body), a cursor control component 450 (e.g., mouse or trackball), and an image capture component 455 (e.g., analog or digital camera). In some implementation, the disk drive component 430 may include an electronic database.

In accordance with embodiments of the present disclosure, the computer system 400 performs specific operations by processor 415 executing one or more sequences of one or more instructions contained in the system memory component 420. Such instructions may be read into system memory component 420 from another computer readable medium, such as a static storage component 425 or a disk drive component 430. In other embodiments, hard-wired circuitry may be used in place of (or in combination with) software instructions to implement the present disclosure.

Logic may be encoded in a computer readable medium, which may refer to any medium that stores instructions to processor 415 for execution. Such a medium may take many forms, including but not limited to, non-volatile media and volatile media. In one embodiment, the computer readable medium is non-transitory. In various implementations, non-volatile media includes optical or magnetic storage devices, such as disk drive component 430, and volatile media includes dynamic memory, such as system memory component 420.

Some common forms of computer readable media includes, for example, floppy storage device, flexible storage device, hard storage device, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer is adapted to read.

In various embodiments of the present disclosure, execution of instruction sequences to practice the present disclosure may be performed by the computer system 400. In various other embodiments of the present disclosure, a plurality of computer systems 400 coupled by a communication link 460 (e.g., a communications network, such as a LAN, WLAN, PTSN, and/or various other wired or wireless networks, including telecommunications, mobile, and cellular phone networks) may perform instruction sequences to practice the present disclosure in coordination with one another.

The computer system 400 may transmit and receive messages, data, information and instructions, including one or more programs (i.e., application code) through the communication link 460 and a communication interface 435. Received program code may be executed by the processor 415 as received and/or stored in the disk drive component 430 or some other non-volatile storage component for execution.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as computer program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

Figure 5:
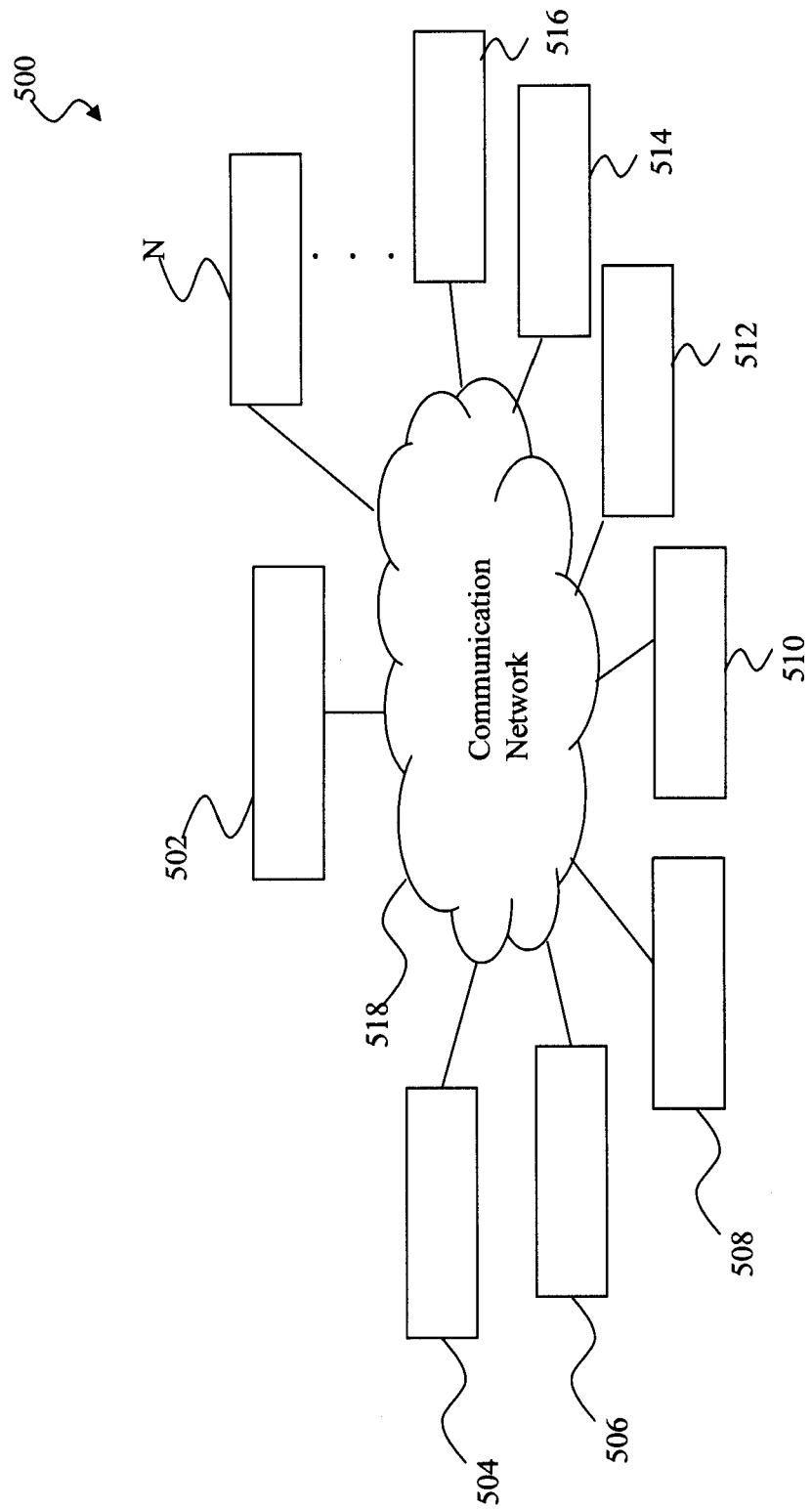
FIG. 5 illustrates an integrated circuit fabrication system according to various aspects of the present disclosure.

FIG. 5 illustrates an integrated circuit fabrication system 500 that may be used to perform the topography-aware LPC simulations and/or actual fabrication of IC devices. The fabrication system 500 includes a plurality of entities 502, 504, 506, 508, 510, 512, 514, 516 . . . , N that are connected by a communications network 518. The network 518 may be a single network or may be a variety of different networks, such as an intranet and the Internet, and may include both wire line and wireless communication channels.

In various embodiments, the entity 502 may represent a service system for manufacturing collaboration, the entity 504 may represent an user, such as product engineer monitoring the interested products, the entity 506 may represent an engineer, such as a processing engineer to control process and the relevant recipes, or an equipment engineer to monitor or tune the conditions and setting of the processing tools, the entity 508 may represent a metrology tool for IC testing and measurement, the entity 510 may represent a semiconductor processing tool, the entity 512 may represent a virtual metrology module associated with the processing tool 510, the entity 514 may represent an advanced processing control module associated with the processing tool 510 and additionally other processing tools, and the entity 516 may represent a sampling module associated with the processing tool 510.

Each entity may interact with other entities and may provide integrated circuit fabrication, processing control, and/or calculating capability to and/or receive such capabilities from the other entities. Each entity may also include one or more computer systems for performing calculations and carrying out automations, for example, the computer system 400 discussed above with reference to FIG. 4. The software instructions may be written in any suitable programming language and may be designed to carry out specific tasks, such establishing/building topography-aware LPC simulation models.

The integrated circuit fabrication system 500 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results. In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 500 may enable collaboration and information access in such areas as design, engineering, and processing, metrology, and advanced processing control. Another capability provided by the IC fabrication system 500 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Based on the discussions above, it can be seen that the present disclosure provides a comprehensive approach to include all inter-layers (e.g., FEOL, BEOL) deposition, etching, planarization, step-scanner responses on the lithography manufacturing system. The topography-aware LPC simulation offers a way to quickly predict effects if the topography-induced defocus to the DOF budget at critical features and refer to LPC contrast parameters. Thus, the embodiments of the present disclosure offer advantages, it being understood that different embodiments may offer different advantages, and not all the advantages are discussed herein, and that no particular advantage is required for all embodiments.

One of the other advantages of certain embodiments of the present disclosure is that, critical patterns that are vulnerable to topography variations may be detected. Timely feedback to designer, layout engineers or OPC engineers may be provided. Another advantage is that the embodiments of the present disclosure enable conventional LPC simulations to perform topography-aware lithography rule checks without disclosing foundry data. Yet another advantage is that the topography-aware LPC simulation models can make more accurate predictions of API (After Polishing Inspection)/AEI (After Etching Inspection) defects.

One of the broader forms of the present disclosure involves a semiconductor device. The semiconductor device includes: receiving a layout design for an integrated circuit (IC) device; performing a lithography pattern check (LPC) simulation on the layout design, the LPC simulation including a topography-aware simulation model; and identifying potential hot spots of the layout design based on the LPC simulation.

In some embodiments, the method includes: fabricating the IC device based on the layout design; collecting topography-related fabrication data from the fabricated IC device; and revising the topography-aware simulation model based on the collected topography-related fabrication data.

In some embodiments, the method includes: repeating the LPC simulation based on the revised topography-aware simulation model.

In some embodiments, the topography-aware simulation model includes a polishing process monitor component.

In some embodiments, the polishing process monitor component includes simulation models for a plurality of process parameters of a polishing process.

In some embodiments, the polishing process monitor component includes simulation models for pattern density variations of semiconductor device features in the layout design.

In some embodiments, the polishing process monitor component includes simulation models for wafer surface topography variations accumulated through a plurality of layers.

In some embodiments, the topography-aware simulation model is established at least partially by determining a relative defocus.

In some embodiments, the layout design includes a Graphical Database System (GDS) file.

Another of the broader forms of the present disclosure involves a method. The method includes: obtaining an integrated circuit (IC) layout; providing a polishing process simulation model; performing a lithography pattern check (LPC) process to the IC layout, the LPC process being performed at least in part using the polishing process simulation model; detecting, in response to the LPC process, possible problem areas on the IC layout; modifying the polishing process simulation model; and repeating the performing the LPC process and the detecting the possible problem areas using the modified polishing process simulation model.

In some embodiments, the method further includes: fabricating an IC based on the IC layout; and gathering actual IC fabrication data.

In some embodiments, the modifying the polishing process simulation model is performed if the actual IC fabrication data indicates the polishing process simulation model needs improvement in accuracy.

In some embodiments, the polishing process simulation model is established for a chemical-mechanical-polishing (CMP) process.

In some embodiments, the polishing process simulation model includes one or more models that account for wafer topography variations as a result of a plurality of manufacturing factors.

In some embodiments, the manufacturing factors include one or more of the following: a plurality of polishing process parameters; wafer pattern density variations; and accumulation of topography variations as a result of stacking multiple layers together.

Still another of the broader forms of the present disclosure involves a non-transitory, tangible machine-readable storage medium storing a computer program, wherein the computer program contains machine-readable instructions that when executed electronically by processors, perform: establishing a topography-aware simulation model; applying a topography-aware lithography pattern check (LPC) simulation process to an integrated circuit (IC) layout, the topography-aware LPC simulation process using the topography-aware simulation model; and determining hot spots in the IC layout in response to the applying of the topography-aware LPC simulation process.

In some embodiments, the computer program further includes: instructions for obtaining actual fabricating data corresponding to the IC layout; and instructions for adjusting the topography-aware simulation model based on the obtained actual fabrication data.

In some embodiments, the computer program further comprises: instructions for applying the topography-aware LPC simulation process to the IC layout again using the adjusted topography-aware simulation model.

In some embodiments, the instructions for establishing the topography-aware simulation model include instructions for establishing models that account for topography variations of the IC layout as a result of a plurality of fabrication-related issues.

In some embodiments, the fabrication-related issues include at least one of the following: a plurality of process parameters for a chemical-mechanical-polishing (CMP) process; pattern density distributions throughout the IC layout; and accumulated topography variations associated with a stacking of a plurality of layers.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
receiving a layout design for an integrated circuit (IC) device;
performing a lithography pattern check (LPC) simulation on a first layer of the layout design, the LPC simulation including a topography-aware simulation model, the topography aware simulation model using data indicating topography variation of a second layer underlying the first layer to determine defocus values for areas of the layout design; and
using the defocus values determined by the LPC simulation, identifying areas of the layout design that have defocus values that are outside a defined depth of focus tolerance range as potential hot spots of the layout design.

2. The method of claim 1, further comprising:
fabricating the IC device based on the layout design;
collecting topography-related fabrication data from the fabricated IC device; and
revising the topography-aware simulation model based on the collected topography-related fabrication data.

3. The method of claim 2, further comprising repeating the LPC simulation based on the revised topography-aware simulation model.

4. The method of claim 1, wherein the topography-aware simulation model includes a polishing process monitor component.

5. The method of claim 4, wherein the polishing process monitor component includes simulation models for a plurality of process parameters of a polishing process.

6. The method of claim 4, wherein the polishing process monitor component includes simulation models for pattern density variations of semiconductor device features in the layout design.

7. The method of claim 4, wherein the polishing process monitor component includes simulation models for wafer surface topography variations accumulated through a plurality of layers.

8. The method of claim 1, wherein the topography-aware simulation model is established at least partially by determining a relative defocus.

9. The method of claim 1, wherein the layout design includes a Graphical Database System (GDS) file and the simulation model is configured to predict both After Polishing Inspection (API) defects and After Etching Inspection (AEI) defects.

10. A method, comprising:
obtaining an integrated circuit (IC) layout of a first layer;
providing a polishing process simulation model;
performing a lithography pattern check (LPC) process to the IC layout, the LPC process being performed at least in part using the polishing process simulation model, the polishing process model using data indicating topography variation of a second layer underlying the first layer to determine defocus values for areas of the IC layout;
detecting, in response to the LPC process, possible problem areas on the IC layout that have a defocus value outside a defined depth of focus tolerance range;
modifying the polishing process simulation model; and
repeating the performing the LPC process and the detecting the possible problem areas using the modified polishing process simulation model.

11. The method of claim 10, further comprising:
fabricating an IC based on the IC layout; and
gathering actual IC fabrication data.

12. The method of claim 11, wherein the modifying the polishing process simulation model is performed if the actual IC fabrication data indicates the polishing process simulation model needs improvement in accuracy.

13. The method of claim 10, wherein the polishing process simulation model is established for a chemical-mechanical-polishing (CMP) process.

14. The method of claim 10, wherein the polishing process simulation model includes one or more models that account for wafer topography variations as a result of a plurality of manufacturing factors.

15. The method of claim 14, wherein the manufacturing factors include one or more of the following:
a plurality of polishing process parameters;
wafer pattern density variations; and
accumulation of topography variations as a result of stacking multiple layers together.

16. An apparatus comprising a non-transitory, tangible machine-readable storage medium storing a computer program, wherein the computer program contains machine-readable instructions that when executed electronically by one or more processors, perform:
establishing a topography-aware simulation model;
applying a topography-aware lithography pattern check (LPC) simulation process to a first layer of an integrated circuit (IC) layout, the topography-aware LPC simulation process using the topography-aware simulation model, the topography aware simulation model using data indicating topography variation of a second layer underlying the first layer to determine defocus values for areas of the IC layout; and
determining hot spots in the IC layout by identifying areas of the IC layout that have defocus values that are outside a defined depth of focus tolerance range.

17. The apparatus of claim 16, wherein the computer program further comprises:
instructions for obtaining actual fabricating data corresponding to the IC layout; and
instructions for adjusting the topography-aware simulation model based on the obtained actual fabrication data.

18. The apparatus of claim 16, wherein the computer program further comprises:
instructions for applying the topography-aware LPC simulation process to the IC layout again using the adjusted topography-aware simulation model.

19. The apparatus of claim 16, wherein the instructions for establishing the topography-aware simulation model include instructions for establishing models that account for topography variations of the IC layout as a result of a plurality of fabrication-related issues.

20. The apparatus of claim 19, wherein the fabrication-related issues include at least one of the following:
a plurality of process parameters for a chemical-mechanical-polishing (CMP) process;
pattern density distributions throughout the IC layout; and
accumulated topography variations associated with a stacking of a plurality of layers.

* * * * *